(12) United States Patent
Han et al.

(10) Patent No.: US 8,354,090 B2
(45) Date of Patent: Jan. 15, 2013

(54) APPARATUS AND METHOD FOR MANUFACTURING QUANTUM DOT

(75) Inventors: Chang-soo Han, Daejeon-si (KR); Sohee Jeong, Daejeon-si (KR); Won-sik Seo, Daejeon-si (KR)

(73) Assignee: Korea Institute of Machinery & Materials, Daejeon-si (KR)

( * ) Notice: Subject to any disclaimer, the term of this patent is extended or adjusted under 35 U.S.C. 154(b) by 47 days.

(21) Appl. No.: 13/126,053

(22) PCT Filed: Oct. 27, 2009

(86) PCT No.: PCT/KR2009/006228
§ 371 (c)(1),
(2), (4) Date: Jun. 1, 2011

(87) PCT Pub. No.: WO2010/050727
PCT Pub. Date: May 6, 2010

(65) Prior Publication Data
US 2011/0223097 A1  Sep. 15, 2011

(30) Foreign Application Priority Data
Oct. 27, 2008  (KR) .................. 10-2008-0105369

(51) Int. Cl.
*C01B 17/00* (2006.01)
*C01B 19/04* (2006.01)
*B01J 19/00* (2006.01)
*F28D 21/00* (2006.01)
(52) U.S. Cl. ........ 423/509; 423/511; 422/198; 422/205; 977/774; 977/896
(58) Field of Classification Search .................. 423/509, 423/511; 422/198, 205; 977/774, 896
See application file for complete search history.

(56) References Cited

U.S. PATENT DOCUMENTS

| | | | |
|---|---|---|---|
| 6,682,596 B2 | 1/2004 | Zehnder et al. | 117/68 |
| 7,833,506 B2 * | 11/2010 | Rauscher et al. | 423/509 |
| 2011/0223097 A1 * | 9/2011 | Han et al. | 423/509 |
| 7,833,506 B2 * | 11/2010 | Rauscher et al. | 423/509 |
| 2011/0223097 A1 * | 9/2011 | Han et al. | 423/509 |

FOREIGN PATENT DOCUMENTS
JP  2007-014849 A  1/2007
KR  10-2008-0070101 A  7/2008

OTHER PUBLICATIONS

Edel, Joshua B. et al. "Microfluidic Routes to the Controlled Production of Nanoparticles"; Chemical Communications; Issue 10, 2002; pp. 1136-1137.
Yang, Hongwei et al.; "Synthesis of Nanocrystals Via Microreaction with Temperature Gradient: Towards Separation of Nucleation and Growth"; Lab on a Chip; Issue 3, 2008; vol. 8; pp. 451-455.
PCT International Search Report dated May 31, 2010 issued in Application No. PCT/KR2009/006228.

* cited by examiner

*Primary Examiner* — Timothy Vanoy
(74) *Attorney, Agent, or Firm* — KED & Associates LLP (57) ABSTRACT

Disclosed is a technique of producing that a technique of producing quantum dots that are nano-size semiconducting crystals. An apparatus of producing quantum dots includes a mixer to mix different kinds of precursor solutions uniformly in a channel by diverging each precursor solution into a plurality of micro streams and joining the diverging micro streams individually with different kinds of micro streams, and a heating furnace to pass the precursor mixture solution discharged from the mixer therethrough to create and grow quantum dot nucleuses, thus producing quantum dots. The mixer may further include a heating unit allowing temperature adjustment. In addition, a buffer which is maintained at a relatively low-temperature is provided between the mixer and the heating furnace in order to prevent additional nucleation. Accordingly, quantum dots may be produced even at a high flow rate, which leads to mass-production of quantum dots.

9 Claims, 7 Drawing Sheets

|  | Red | Orange | Yellow | Green | Green |
|---|---|---|---|---|---|
| PL Max (nm) | 601nm | 582nm | 570nm | 555nm | 518nm |
| FWHM | 35nm | 37nm | 33nm | 34nm | 33nm |

APPARATUS AND METHOD FOR MANUFACTURING QUANTUM DOT

TECHNICAL FIELD

The present invention relates to a technique of producing quantum dots that are nano-size semiconducting crystals.

BACKGROUND ART

Bulky quantum dots exhibit unique optical/electrical properties which no semiconducting materials shows. Due to these unique properties, nano quantum dots are becoming of central interest as a material for next-generation high-brightness LEDs, biosensors, lasers, solar cells, etc.

Conventionally, quantum dots have been produced mainly in laboratories in such a way to quickly inject cooled precursors into a high-temperature solvent to create nucleuses and then grow the nucleuses under the appropriate temperature conditions. However, the conventional method has limitations in respect to mass production of quantum dots, since it has poor reaction control to make the particle sizes non-uniform and cause great loss in subsequent processes due to reaction conditions depending on the amount of particles, which severely reduces the production amount. Particularly, in the case of quantum dots, the particle size has a direct influence on the optical/electrical properties, uniformity in particle diameter is linked directly with the quality of quantum dots and if the non-uniformity exceeds a predetermined limit, the quantum dots lose their unique qualities and become commercially worthless.

U.S. Pat. No. 6,682,596 discloses a method of combining reactants with a solvent to form a solution and continuously passing the solution at a selected flow rate through a thermally conductive tube that is maintained at a temperature sufficiently high, thereby producing a product mixture containing nanocrystals. This method exhibits excellent uniformity in diameter upon low-volume production, but still has a limitation that it is difficult to be applied to mass-production due to non-uniform mixing through a narrow tube.

Technical Problem

The present invention provides an apparatus and method for mass production of quantum dots.

The present invention also provides an apparatus and method for mass-producing quantum dots with uniform particle diameters at high yield.

Additional features of the invention will be set forth in the description which follows, and in part will be apparent from the description, or may be learned by practice of the invention.

Technical Solution

According to an exemplary aspect, there is provided a quantum dot producing apparatus including a micro mixer in which a plurality of precursor solutions are mixed in such a manner that a plurality of paths diverge from each of a plurality of input ports to which the precursor solutions are respectively supplied, the diverging paths joining with other paths diverging from the other one of the input ports, and then the joined paths are collected into an output port.

A mixing ratio of precursors influences a particle diameter. When precursor solutions are abruptly mixed, the mixing ratio of precursors varies locally to cause irregular reactions, which leads to non-uniformity of particle diameters. The non-uniform mixing is one of reasons why conventional quantum dot producing methods including the U.S. Pat. No. 6,682,596 have failed to mass-produce quantum dots.

Meanwhile, the mixer according to the present invention mixes precursor solutions flowing therethrough very uniformly over the entire area, which leads to uniform nucleation. The mixer solves the problem that the U.S. Pat. No. 6,682,596 has failed to mass-produce quantum dots since the wider a tube diameter, the more difficult uniform mixing. The mixer adopts a method similar to mixing thorough several dozens or hundreds of tubes each having a size similar to that adopted in the U.S. Pat. No. 6,682,596. Accordingly, the mixer according to the present invention achieves mass-production of quantum dots.

As described above, according to the present invention, by diverging each of a plurality of precursor solutions into micro streams, joining the diverging micro streams in pairs with each other and then collecting the joining streams, the precursor solutions can be mixed at a constant rate, which leads to mass-production of quantum dots.

According to another embodiment, the mixer of mixing the precursor solutions is heated. In this case, the heating temperature may be a temperature at which quantum dots are created.

Even when the mixer remains at room temperature, some quantum dot nucleuses are created during the process of mixing the precursor solutions. These unintended quantum dot nucleuses have an adverse effect upon uniformity of particle diameter. In the current embodiment, the mixer is disposed inside a heating furnace so as to perform nucleation uniformly in a short time, thereby further improving uniformity of particle diameter.

According to another exemplary embodiment, the quantum dot producing apparatus further includes a buffer which is disposed between the mixer that is heated and a heating furnace and which passes a precursor mixture at a relatively low temperature.

The buffer functions to stop the process of quantum dot nucleation such that the process of nucleation is more completely separated from the process of nuclear growth, which further improves uniformity in particle size of quantum dots.

According to another exemplary embodiment, the quantum dot producing apparatus heats the precursor mixture solution through a first heating part that is heated to a first temperature and then sequentially heats through a second heating part that is heated to a second temperature lower than the first temperature.

In the case of a quantum dot producing apparatus utilizing a single heating furnace, nucleation and nuclear growth may occur simultaneously or inconstantly, thus resulting in creation of different sizes of quantum dot nucleuses.

In general, a temperature range for nucleation of quantum dots partially overlaps a temperature range for nuclear growth, but the temperature range for nucleation is relatively higher than the temperature range for nuclear growth. In the current embodiment, nucleation is separated from nuclear growth to an appropriate degree by separately providing a first temperature condition under which nucleation occurs and a second temperature condition under which nuclear growth occurs, which leads to uniformity improvement of particle size.

The quantum dot producing apparatus according to the current embodiment further includes a buffer disposed between the first heating furnace and the second heating furnace, and passing a solution through the buffer which is at a third temperature that is lower than the first and second temperatures.

The buffer functions to stop the process of quantum dot nucleation such that the process of nucleation is more completely separated from the process of nuclear growth, which further improves uniformity in particle size of quantum dots.
Advantageous Effects As described above, according to the present invention, by mixing precursor solutions in such a manner as to diverge each precursor solution into micro streams, mix the diverging micro streams in pairs and then collect the mixture, a large amount of solutions can be mixed uniformly like when a small amount of solutions is mixed, thereby achieving mass-production of quantum dots.

Also, by separating a process of nucleating quantum dots from a process of growing quantum dot nucleuses, quantum dots with uniform particle diameters can be produced at high yield.

DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

MODE FOR INVENTION

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 1:
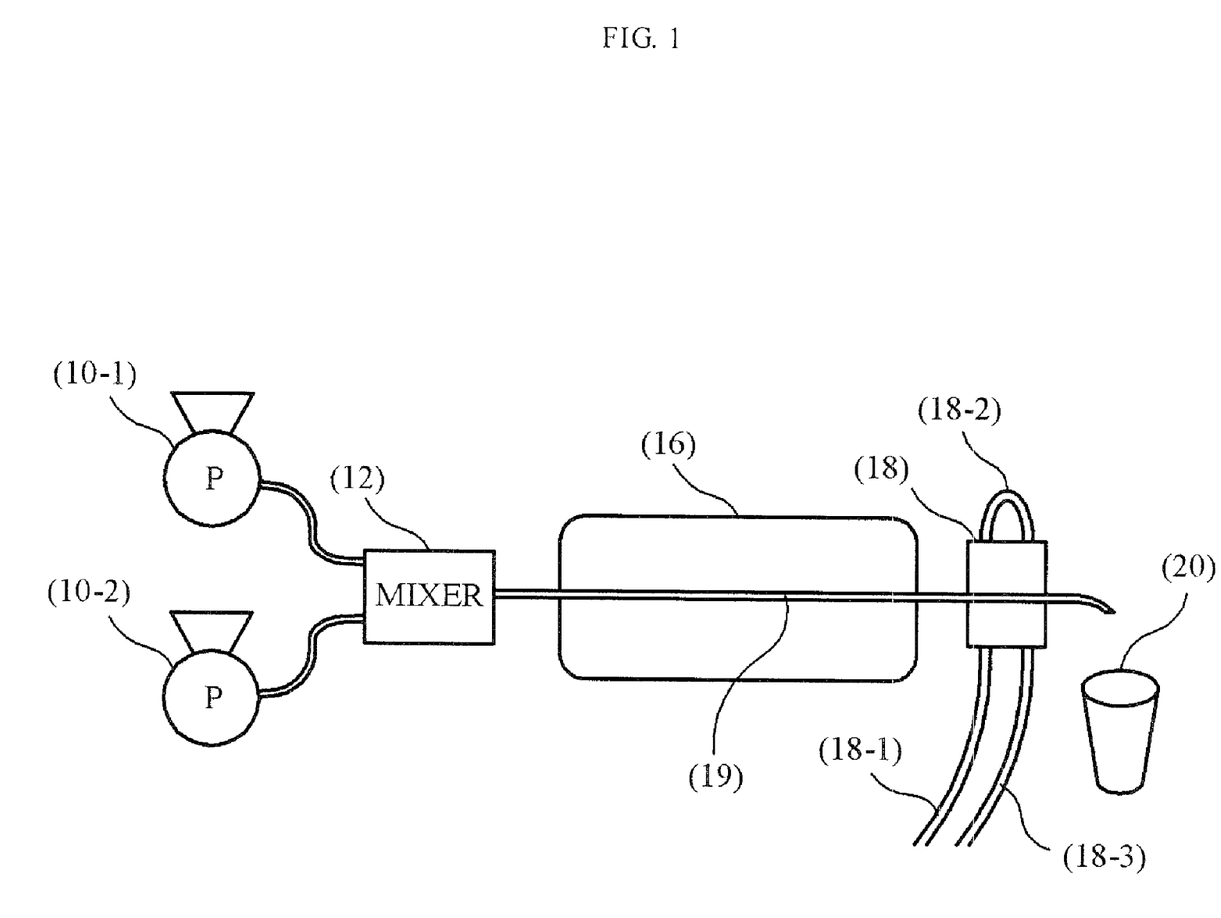
FIG. 1 shows a schematic configuration of a quantum dot producing apparatus according to an exemplary embodiment.

FIG. 1 shows a schematic configuration of a quantum dot producing apparatus according to an exemplary embodiment. Referring to FIG. 1, the quantum dot producing apparatus includes pumps 10-1 and 10-2 for respectively injecting precursor solutions in which different kinds of precursors are dissolved at a constant flow rate and at a constant speed, a mixer 12 where the precursor solutions are mixed, and a heating furnace 16 which passes the precursor mixture solution to create and grow nucleuses.

In the current embodiment, the precursor solutions may be a Cd precursor solution and a Se precursor solution which has been highly commercially utilized in recent years. The Cd precursor solution is made by dissolving Cadmium salt, Squalane and Oleic acid at 150° C. under inert atmospheres of nitrogen or the like in a 3-Neck Round Bottom Flask, reacting the solution for 90 minutes under vacuum conditions of 100° C. to form Cadmium oleate, removing impurities such as water from the Cadmium oleate, then cooling the resultant Cadmium oleate to room temperature to form precursors and then adding Oleylamine into the precursors. The Se precursor solution is prepared by dissolving Selenium shot in Tri-n-octylphosphine to form a TOP Se solution and diluting the TOP Se solution with Squalane.

The Ce and Se precursor solutions are supplied into the mixer 12 through the pumps 10-1 and 10-2. The pumps 10-1 and 10-2 are flow pumps for supplying fluid uniformly. The pumping speed of a flow pump is generally within a range of 0.01-1000 ml/min. The two precursor solutions may be supplied from separate pumps or from a single flow pump with a plurality of channels connected to a driving source to supply a constant quantity of flow. The two precursor solutions may be supplied at a constant flow rate or at different flow rates. The precursor proportion in the precursor solutions influences the size of the finally produced quantum dots. A mixing ratio of the two precursor solutions influences the size of the finally produced quantum dots. A mixing ratio of a Cd precursor solution and a Se precursor solution is generally within a range from 2:1 to 1:30.

Figure 2:
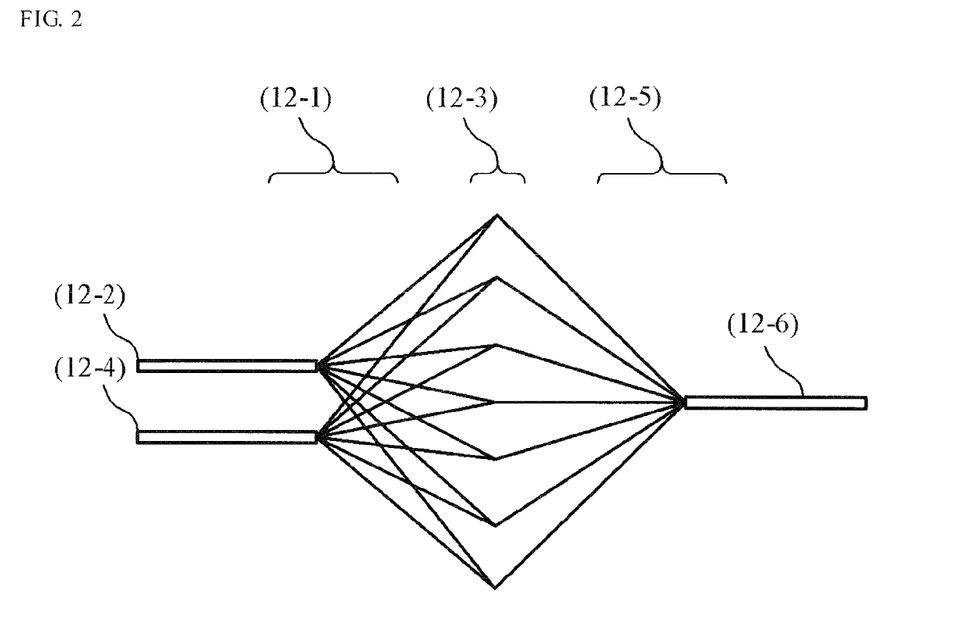
FIG. 2 shows a schematic structure of a mixer according to an exemplary embodiment.

FIG. 2 shows a schematic structure of the mixer 12 according to an exemplary embodiment. As shown in FIG. 2, the mixer 12 has a structure where a plurality of paths diverge from each of two input ports 12-2 and 12-4 to which the two precursor solutions are respectively supplied, the diverging paths joining with other paths diverging from the other one of the two input ports 12-2 and 12-4, and then the joined paths are collected into an output port 12-6.

The plurality of paths, which are pipes (hereinafter, referred to as micro pipes) diverging from the input ports 12-2 and 12-4, are under the same hydrodynamical conditions. Accordingly, precursor solutions injected through the input ports 12-2 and 12-4 are divided into a plurality of streams having the same flow rate. Each micro pipe has a diameter of several microns, for example, about 2.5 μm. Micro pipes diverging from one of the input ports 12-2 and 12-4 join one by one with micro pipes diverging from the other of the input ports 12-2 and 12-4. In the area 12-3 where the micro pipes join with each other, the streams of the precursor solutions are mixed. In order to facilitate the mixing in the mixing area 12-3, the micro pipes may be twisted before the front part of the mixing area 12-3 to form turbulence in the precursor solutions near the mixing area 12-3. In addition, it is also important to ensure the maximum cross-section of an area where two pipes join with each other by minimizing the angle at which the two pipes meet.

The streams may be made by joining independent pipes physically separated or by appropriately designing an internal structure of a mixer to be suitable for the purpose.

The pipes joining in the mixing area 12-3 are collected into the output port 12-6 (the collecting area is denoted by 12-5 in FIG. 2). Since the two precursor solutions have already been mixed sufficiently in the mixing area 12-3, the collecting area 12-5 does not need to have any special structure for mixing.

The term "pipe" used in this specification has to be interpreted to include any structure capable of controlling the flow of fluid while passing it therethrough, as well as a tube-shaped pipe. For example, the pipe may have a structure manufactured by patterning the facing sides of two metal plates and then bonding them.

In the current embodiment, micro pipes that are manufactured by patterning metal plates are more effective.

Figure 3:
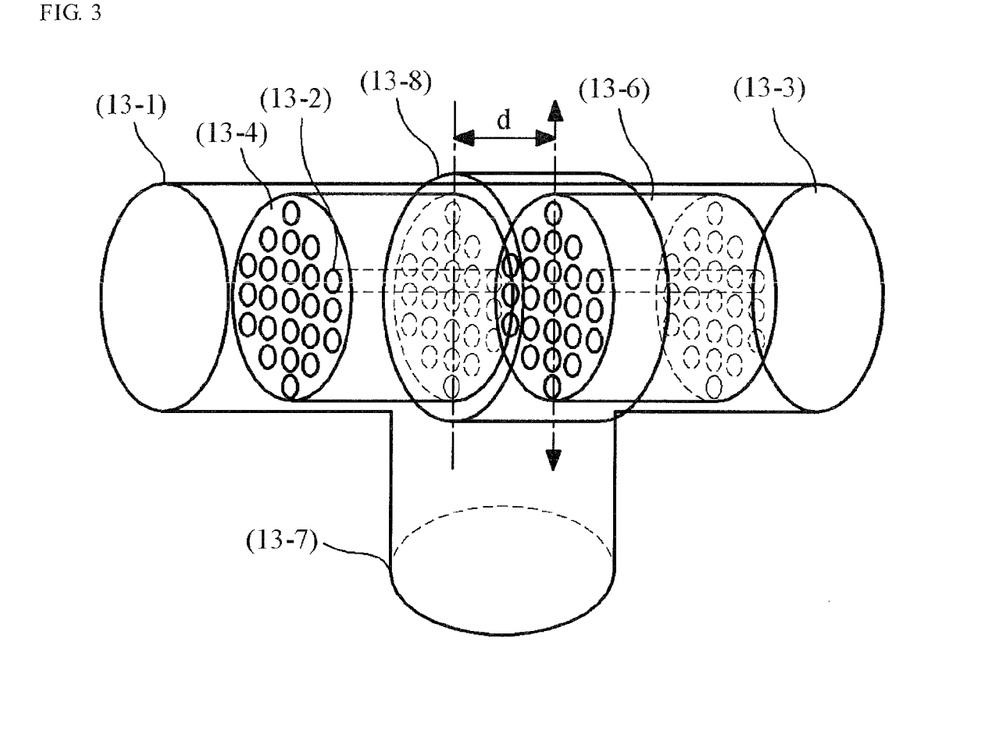
FIG. 3 shows a schematic structure of a mixer according to another exemplary embodiment.

FIG. 3 shows a schematic structure of a mixer according to another exemplary embodiment. The mixer has a structure where two kinds of precursor solutions supplied through two input ports 13-1 and 13-3 each is divided into a plurality of micro streams through a diverging pipe 13-4 into which a plurality of through holes (13-2) perforate, and the micro streams are collided and mixed with micro streams from the other diverging tube 13-6 in a mixing part 12-8. Each of the micro streams extends to a certain degree even after passing through the diverging tubes 13-4 and 13-6, due to pressure application caused by pumping. The length d of the mixing part 13-8 is set to be sufficiently narrow in consideration of a pumping pressure, etc.

The streams in the mixing part 13-8 are collected on the way to an output port 13-7. The area where the streams are collected may vary depending on the direction in which the mixer 12 is disposed and the gravity direction. The output port 13-7 has an appropriate diameter to be suitable for the flow rates of the input ports 13-1 and 13-3 so that the streams can be mixed with their stream shapes in the mixing part 13-8.

Accordingly, since the inflowing precursor solutions pumped are mixed with fine stream shapes, uniform mixing is achieved.

A pipe 19 joined to the output port 12-6 of the mixer 12 is made of a material with high thermal conductivity such as copper. The pipe 19 traverses the heating furnace 16 and a cooling unit 18. In FIG. 1, the pipe 19 has a linear structure, but may have a spiral shape or any other curved shape to improve the efficiency of heating or cooling. In the precursor mixture solution passing through the heating furnace 16, quantum dot nucleuses are created and grown, thereby finally producing quantum dots.

According to another exemplary embodiment, the mixer 12 may further include a mixer heating unit surrounding the mixer 12 to heat the mixer 12 to a predetermined temperature. In this case, the mixer heating unit may be implemented as heat wires installed inside the mixer 12. Due to the installation of the mixer heating unit, substantially two heating units are provided. The mixer heating unit is heated to a first temperature suitable for nucleation. Meanwhile, the heating furnace 16 is heated to a second temperature suitable for nuclear growth. The mixer heating unit is maintained at a higher temperature than that of the heating furnace 16. In this case, the heating unit 15 is longer than the mixer heating unit. In addition, in order to produce quantum dots having small diameters, the mixer heating unit is maintained at a higher temperature than that of the heating furnace 16, and in order to produce quantum dots having great diameters, the mixer heating unit is set to a lower temperature than that of the heating furnace 16.

A heating temperature of the mixer heating unit may be within a range from 170° C. to 380° C. and a heating temperature of the heating furnace 16 may be within a range from 260° C. to 350° C.

The present inventors found the fact that nucleation continuously occurring during growth of quantum dot nucleus is a major factor making the diameters of quantum dots non-uniform. Thus, the present inventors have made an effort to maximally separate nucleation from nuclear growth. Nucleation of quantum dots requires a higher temperature than growth of quantum dots does. Accordingly, the mixer heating unit is set to a relatively high temperature and is relatively short. Accordingly the mixture solution is exposed to a high temperature for a short time. This short-time heating is effective in making particle diameters uniform since nucleation occurs for a very short time. The heating furnace 16 provides a relatively low temperature condition and is relatively long.

Quantum dot nucleuses created in the mixer heating unit are grown in the heating furnace 16 by precursors remaining in the solution. The time for which the solution stays in the heating furnace 16 has a direct influence on the mean diameter of finally produced quantum dots.

According to another exemplary embodiment, the quantum dot producing apparatus further includes a buffer between the mixer heating unit and the heating furnace 16, which passes the solution therethrough at a relatively low temperature. In the current embodiment, the buffer may be simply implemented as an area where the pipe 19 is exposed in the air between the mixer 12 and heating furnace 16. While the precursor solution passes through the buffer, the solution is exposed to room temperature and accordingly nucleation is substantially stopped. Due to the provision of the buffer, nucleation is more completely separated from nuclear growth. However, the buffer may be a low-temperature heating unit, or an air-cooled type or water-cooled type cooler.

Growth of the quantum dots grown to a desired size in the heating furnace 16 is completely stopped when they pass through the cooling unit 18. The cooling unit 18 is a water-cooled type that supplies circulating water jackets through pipes 18-1, 18-2 and 18-3 to dissipate heat. However, the cooling unit 18 is not limited to this and may be any other type such as an air-cooled type. The solution containing finally produced quantum dots is discharged to a container 20.

Figure 4:
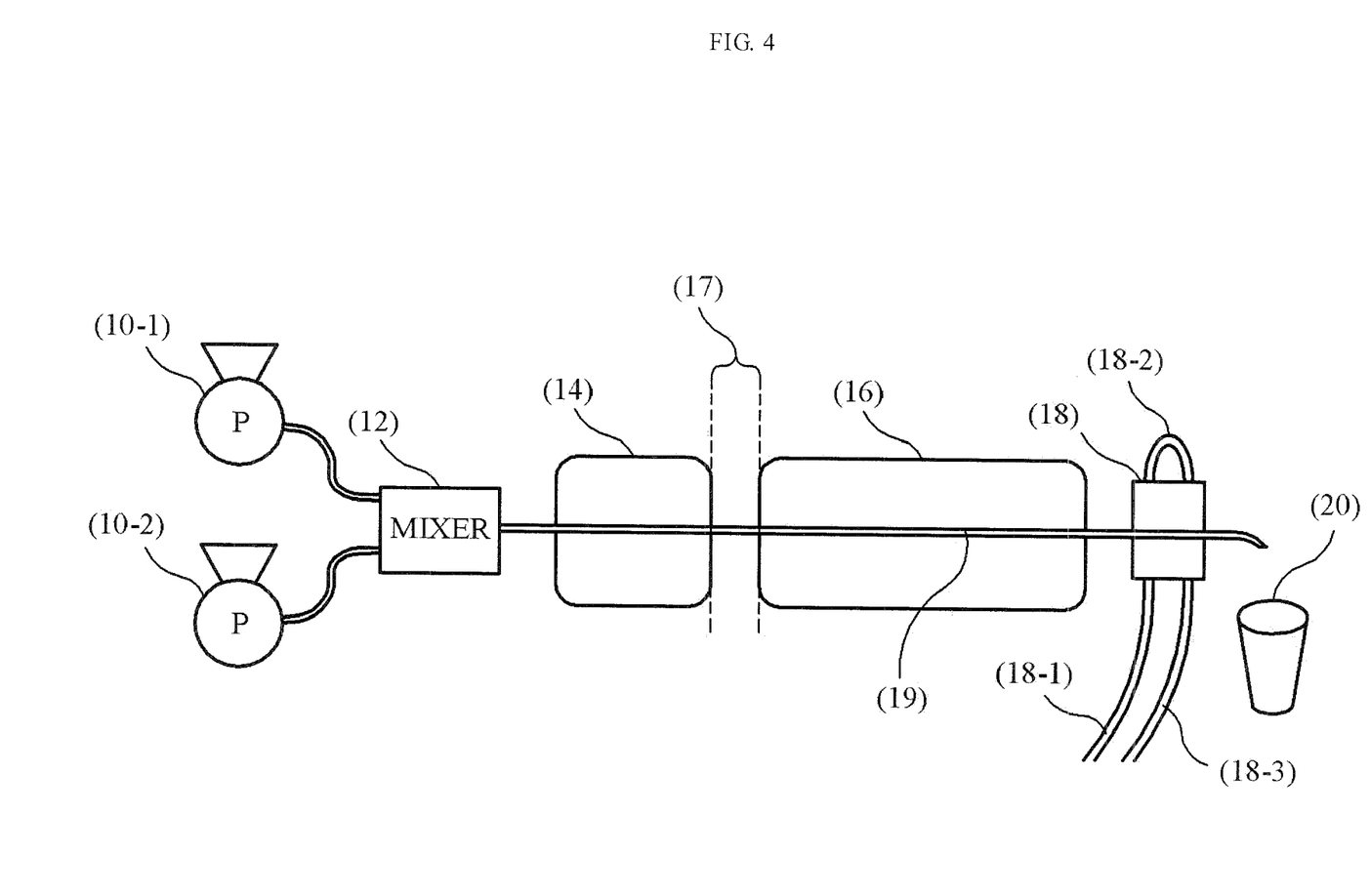
FIG. 4 shows a schematic configuration of a quantum dot producing apparatus according to another exemplary embodiment.

FIG. 4 shows a schematic configuration of a quantum dot producing apparatus according to another exemplary embodiment. As illustrated in FIG. 4, the quantum dot producing apparatus includes pumps 10-1 and 10-2 for respectively injecting precursor solutions in which different kinds of precursors are dissolved at a constant flow rate and at a constant speed, a mixer 12 where the precursor solutions are mixed, a first heating part 14 which passes the mixture solution therethrough under a first temperature condition to create a plurality of quantum dot nucleuses, and a second heating part 16 which passes the mixture solution therethrough under a second temperature condition to grow the quantum dot nucleus by remainder precursor existing in the solution. The heating parts 14 and 16 may be implemented as separate heating furnaces or may be implemented as a single heating furnace having two heating areas whose internal temperatures can be independently adjusted. For example, a visually single furnace may be considered to be two heating units when two independent groups of heat wires are arranged inside the furnace.

In the current embodiment, the precursor solutions may be a Cd precursor solution and a Se precursor solution which has been highly commercially utilized in recent years. The Cd precursor solution is made by dissolving Cadmium salt, Squalane and Oleic acid at 150° C. under inert atmospheres of nitrogen or the like in a 3-Neck Round Bottom Flask, reacting the solution for 90 minutes under vacuum conditions of 100° C. to form Cadmium oleate, removing impurities such as water from the Cadmium oleate, then cooling the resultant Cadmium oleate to room temperature to form precursors and then adding Oleylamine into the precursors. The Se precursor solution is prepared by dissolving Selenium shot in Tri-n-octylphosphine to form a TOP Se solution and diluting the TOP Se solution with Squalane.

The Ce and Se precursor solutions are supplied into the mixer 12 through the pumps 10-1 and 10-2. The pumps 10-1 and 10-2 are flow pumps for supplying fluid uniformly. The pumping speed of a flow pump is generally within a range of 0.01-1000 ml/min. However, the pumping speed of the pumps 10-1 and 10-12 is not limited to this range. The two precursor solutions may be supplied from separate pumps or from a single flow pump with a plurality of channels connected to a driving source to supply a constant quantity of flow. The two precursor solutions may be supplied at a constant flow rate or at different flow rates. The precursor proportion in the precursor solutions influences the size of the finally produced quantum dots. In the current embodiment, a mixing ratio of the two precursor solutions influence the particle diameter of finally produced quantum dots. A mixing ratio of a Cd precursor solution and a Se precursor solution is generally within a range from 2:1 to 1:30.

In the current embodiment, the mixer 12 has a structure similar to the mixer structure illustrated in FIGS. 2 and 3. A pipe 19 joined to the output port 12-6 of the mixer 12 is made of a material with high thermal conductivity such as copper. The pipe 19 traverses the first heating part 14, the second heating part 16 and a cooling unit 18. In the drawing, the pipe 19 has a linear structure, but may have a spiral shape or any other curved shape to improve the efficiency of heating or cooling.

In the current embodiment, the first heating part 14 and the second heating part 16 have the same width but the second heating part 16 is much longer than the first heating part 14. In addition, in order to produce quantum dots having small diameters, the first heating part 14 is maintained at a higher temperature than that of the second heating part 16, and in order to produce quantum dots having great diameters, the first heating part 14 is set to a lower temperature than that of the second heating part 16. A heating temperature of the first heating part 14 may be within a range from 170° C. to 380° C. and a heating temperature of the second heating part 16 may be within a range from 260° C. to 350° C.

The present inventors found the fact that nucleation continuously occurring during growth of quantum dot nucleus is a major factor making the diameters of quantum dots non-uniform. Thus, the present inventors have made an effort to maximally separate nucleation from nuclear growth. Creation of quantum dot nucleuses generally requires a higher temperature than that required for growth of quantum dot nucleuses. For this reason, the first heating part 14 is heated to a relatively high temperature and is relatively short. Accordingly, the mixture solution passing through the first heating part 14 is exposed to a high temperature for a short time. This short-time heating is effective in making particle diameters uniform since nucleation occurs for a very short time. The second heating part 16 provides a relatively low temperature condition and is relatively long. Quantum dot nucleuses created in the first heating part 14 are grown in the second heating part 16 by precursors remaining in the solution. The time for which the solution stays in the second heating part 16 has a direct influence on the mean diameter of finally produced quantum dots.

According to another exemplary embodiment, the quantum dot producing apparatus further includes a buffer 17 between the first heating part 14 and the second heating part 16, which passes the solution therethrough at a third temperature that is lower than the first and second temperatures. In the current embodiment, the buffer 17 may be simply implemented as an area where the pipe 19 is exposed in the air between the first and second heating parts 14 and 16. While the precursor solution passes through the buffer 17, the solution is exposed to room temperature and accordingly nucleation is substantially stopped. Due to the provision of the buffer 17, nucleation is more completely separated from nuclear growth. However, the buffer 17 may be a low-temperature heating unit, or an air-cooled type or water-cooled type cooler.

Growth of the quantum dots grown to a desired size in the second heating part 16 is completely stopped when they pass through the cooling unit 18. The cooling unit 18 is a water-cooled type that supplies circulating water jackets through pipes 18-1, 18-2 and 18-3 to dissipate heat. However, the cooling unit 18 is not limited to this and may be any other type such as an air-cooled type. The solution containing finally produced quantum dots is discharged to a container 20.

Figure 5:
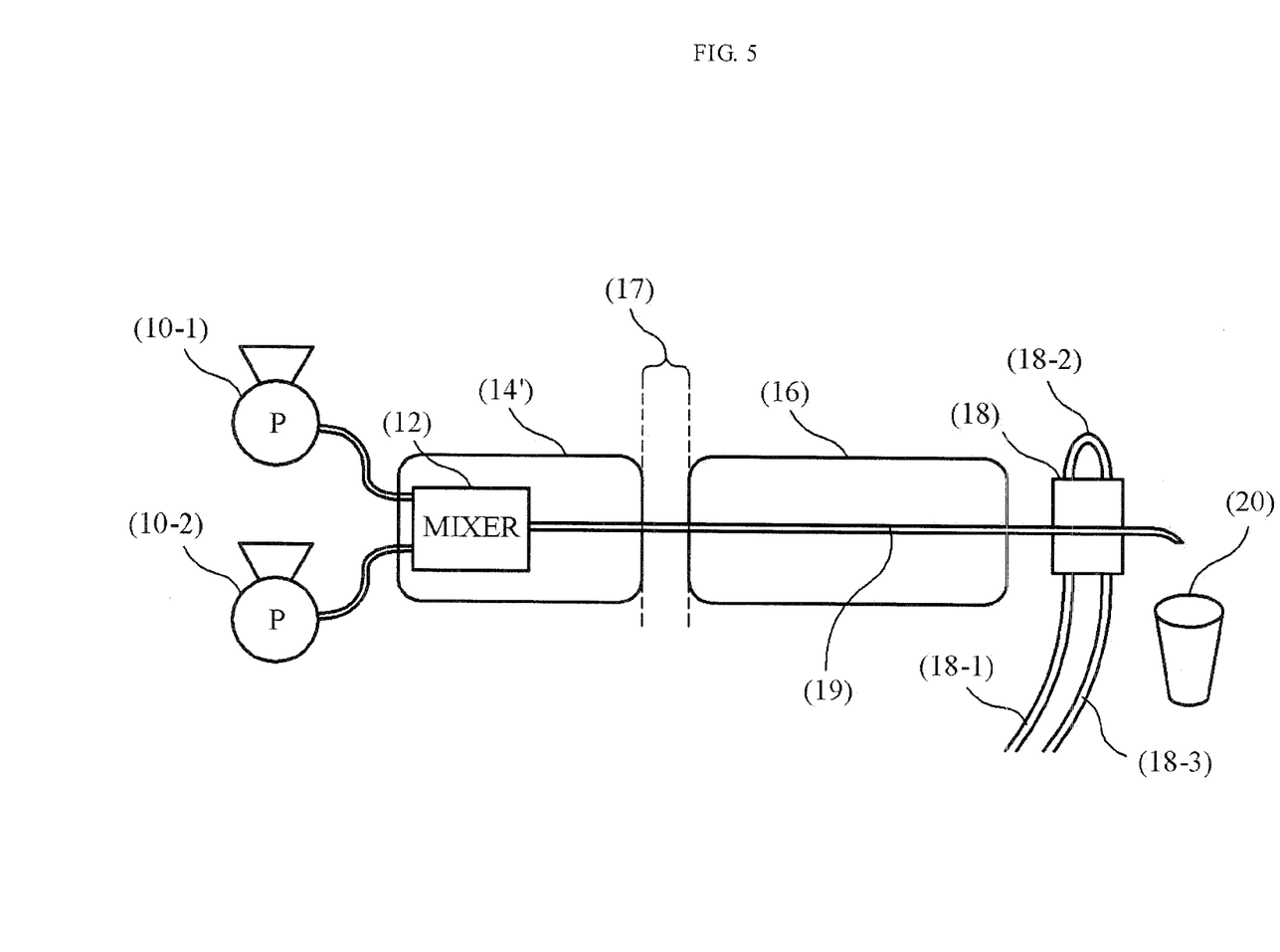
FIG. 5 shows a schematic configuration of a quantum dot producing apparatus according to another exemplary embodiment.

FIG. 5 shows a schematic configuration of a quantum dot producing apparatus according to another exemplary embodiment. In FIG. 5, like reference numerals in FIG. 4 denote like elements. As illustrated in FIG. 5, the quantum dot producing apparatus further includes a mixer heating unit 14' which surrounds a mixer 12 to heat the mixer 12 to a predetermined temperature. In the current embodiment, the mixer heating unit 14' corresponds to the first heating part 14' and the mixer 12 is placed in the first heating part 14'. However, it is also possible that the mixer heating unit and the first heating part are provided as separate heating elements. As another example, the mixer heating unit 14' may be implemented as heat wires installed inside the mixer 12.

While the mixer 12 mixes precursor solutions, quantum dot nucleuses may be created even at room temperature. In the current embodiment, since the mixer 12 is maintained at a high temperature inside the first heating part 14', relatively constant temperature conditions are maintained from when the two precursor solutions are mixed to when the mixture solution exits the first heating part 14', which further improves diameter uniformity of nucleuses.

Hereinafter, a quantum dot producing method according to an exemplary embodiment will be described. The quantum dots producing method includes: pumping a plurality of precursor solutions in which different kinds of precursors are dissolved to supply the plurality of precursor solutions; mixing the plurality of precursor solutions uniformly; and heating the mixture solution by passing the mixture solution through a heating furnace to create and grow nucleuses.

The heating operation includes: heating the mixture solution to a first temperature while passing the mixture solution to create quantum dot nucleuses; and heating the mixture solution to a second temperature while passing the mixture solution to grow the quantum dot nucleuses using precursors remaining in the mixture solution. It is preferable that a first temperature for nucleation is higher than a second temperature for nuclear growth and nucleation occurs in a shorter time than nuclear growth does. Also, between the nucleation and nuclear growth operations, a buffering operation may be provided which exposes the solution to a third temperature lower than the first and second temperatures to cool the solution.

According to another embodiment, the mixing operation may be carried out while heating the solution to a predetermined temperature. In this case, between the mixing operation and the heating operation, there may be further provided buffering operation of passing the precursor mixture through a relatively low-temperature area.

Figure 6:
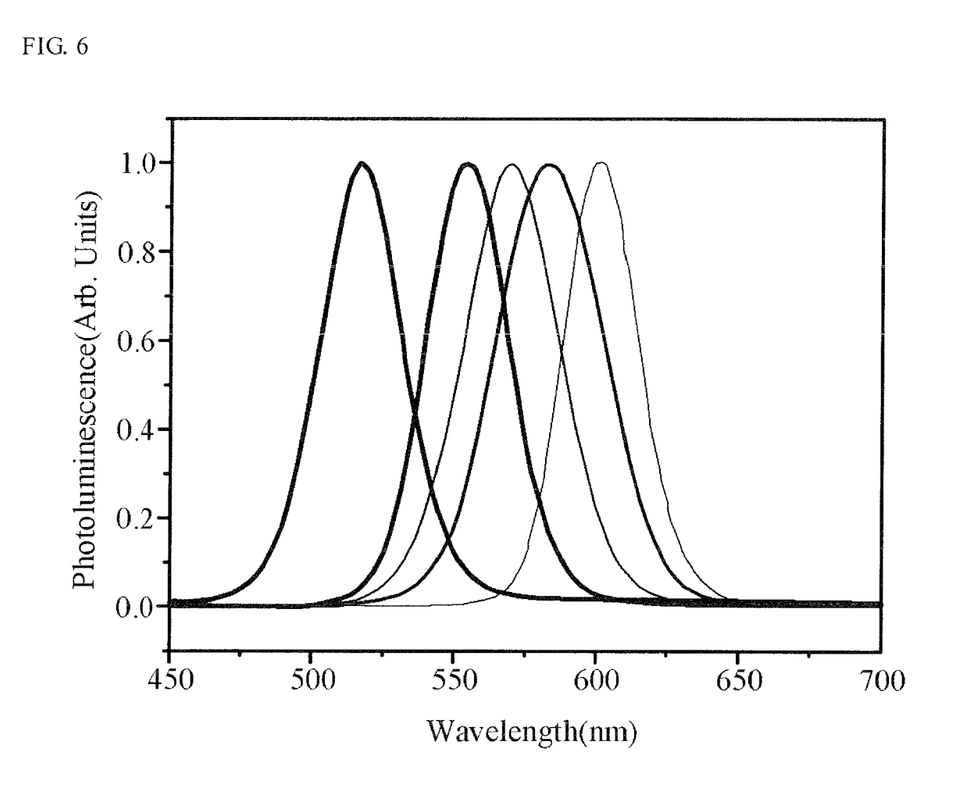
FIGS. 6 and 7 show experimental results representing variations in quantum dot size with respect to variations in temperature of first and second heating furnaces when the quantum dot producing apparatus illustrated in FIG. 4 is utilized.
Figure 7:
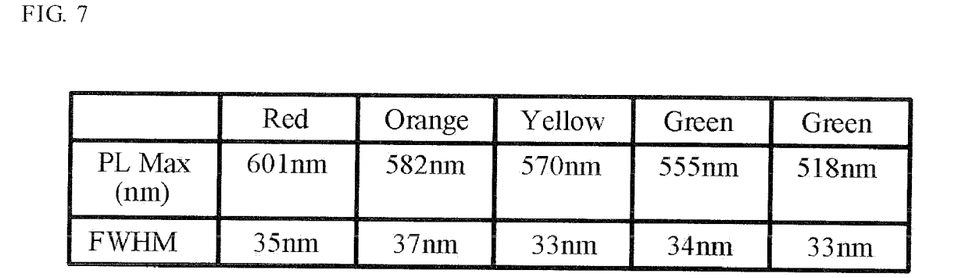

FIGS. 6 and 7 show experimental results representing variations in quantum dot size with respect to variations in temperature of the first and second heating parts 14 and 16 when the quantum dot producing apparatus illustrated in FIG. 4 is utilized. The particle size of quantum dots has a close relation to photoluminescence wavelengths. If the flow rate is 1 ml/min and the mixing ratio of precursors is 1:1, quantum dots emitting light at 600 nm are produced when the first and second heating parts 14 and 16 are respectively heated to 170° C. and 380° C., quantum dots emitting light at 580 nm are produced when the first and second heating parts 14 and 16 are respectively heated to 170° C. and 360° C., quantum dots emitting light at 570 nm are produced when the first and second heating parts 14 and 16 are respectively heated to 270° C. and 330° C., quantum dots emitting light at 550 nm are produced when the first and second heating parts 14 and 16 are respectively heated to 380° C. and 300° C., and quantum dots emitting light at 520 nm are produced when the first and second heating parts 14 and 16 are respectively heated to 380° C. and 260° C. FIG. 7 is a table showing uniformity in particle diameter of finally produced quantum dots. It is seen in the table of FIG. 7 that quantum dots (FWHM 35 nm) having very high uniformity are produced at a high flow rate (at 1 ml/min in the current embodiment) without any additional process. That is, by utilizing the mixer according to the current embodiment, mass production of quantum dots having a tailored yet uniform size can be achieved It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. An apparatus of producing quantum dots, comprising:
at least one pump to inject a plurality of precursor solutions in which different kinds of precursors are dissolved at a predetermined flow rate;
a micro mixer in which a plurality of precursor solutions are mixed in such a manner that a plurality of paths diverge from each of a plurality of input ports to which the precursor solutions are respectively supplied, the diverging paths joining with other paths diverging from the other one of the input ports, and then the joined paths are collected into an output port; and
a heating furnace to pass the precursor mixture solution therethrough to create and grow quantum dot nucleuses, thus producing quantum dots.

2. The apparatus of claim 1, further comprising a mixer heating unit surrounding the micro mixer to heat the micro mixer to a predetermined temperature.

3. The apparatus of claim 2, further comprising a buffer to provide a relatively low-temperature condition between the mixer heating furnace and the heating furnace.

4. The apparatus of claim 2, wherein the heating furnace acts as the mixer heating unit and the micro mixer is positioned in the heating furnace.

5. The apparatus of claim 1, further comprising a cooling unit to quickly cool a solution discharged from the heating furnace.

6. A method of producing quantum dots, comprising:
pumping a plurality of precursor solutions in which different kinds of precursors are dissolved to supply each precursor solution at a predetermined flow rate and at a constant speed;
mixing the plurality of precursor solutions by diverging each precursor solution into a plurality of micro streams, joining each diverging micro stream to a micro stream diverging from another precursor solution and then collecting the joining streams; and
heating the precursor mixture solution to a predetermined temperature to create and grow quantum dot nucleuses, thus producing quantum dots.

7. The method of claim 6, wherein the mixing of the precursor solutions is performed while heating the precursor solutions to a predetermined temperature.

8. The method of claim 7, further comprising passing the precursor mixture solution through a relatively low-temperature area, between the mixing of the precursor solutions and the heating of the precursor mixture solution.

9. The method of claim 6, after the heating of the precursor mixture solution, further comprising quickly cooling the heated solution.

* * * * *